US011089564B2

(12) United States Patent
Lee et al.

(10) Patent No.: US 11,089,564 B2
(45) Date of Patent: Aug. 10, 2021

(54) METHOD AND APPARATUS FOR ESTIMATING POSITION IN WIRELESS COMMUNICATION SYSTEM

(71) Applicant: Samsung Electronics Co., Ltd, Suwon-si (KR)

(72) Inventors: Jung-Yub Lee, Yongin-si (KR); Jun-Sig Kum, Yongin-si (KR); Young-Ju Lee, Seoul (KR); Do-Hyuk Ha, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 15/755,002

(22) PCT Filed: Aug. 25, 2016

(86) PCT No.: PCT/KR2016/009452
§ 371 (c)(1),
(2) Date: Feb. 23, 2018

(87) PCT Pub. No.: WO2017/034348
PCT Pub. Date: Mar. 2, 2017

(65) Prior Publication Data
US 2020/0229123 A1    Jul. 16, 2020

(30) Foreign Application Priority Data
Aug. 25, 2015    (KR) .................. 10-2015-0119641

(51) Int. Cl.
*H04W 24/00*    (2009.01)
*H04W 64/00*    (2009.01)
(Continued)

(52) U.S. Cl.
CPC ............ *H04W 64/003* (2013.01); *G01B 7/14* (2013.01); *G01R 33/4833* (2013.01); *H04W 4/029* (2018.02)

(58) Field of Classification Search
CPC ...... H04W 64/003; H04W 4/029; G01B 7/14; H01R 33/4833; H04M 1/72519; H04M 1/72522
(Continued)

(56) References Cited

U.S. PATENT DOCUMENTS 8,683,707 B1    4/2014    Horton, Jr.
8,855,671 B1    10/2014    Mirov
(Continued)

FOREIGN PATENT DOCUMENTS

EP    2602590 A1    6/2013
EP    2615419 A2    7/2013
(Continued)

OTHER PUBLICATIONS

International Search Report dated Oct. 31, 2016 in connection with International Patent Application No. PCT/KR2016/009452.
(Continued)

*Primary Examiner* — Danh C Le

(57) ABSTRACT

The present disclosure relates to a communication technique for combining a 5G communication system for supporting a higher data transmission rate than a 4G system with an IoT technology, and a system therefor. The present disclosure can be applied to 5G communication technology and IoT related technology-based intelligent services (for example, smart homes, smart buildings, smart cities, smart cars or connected cars, health care, digital education, retail businesses, security and safety related services, etc.). A method in which a transmitter estimates a position in a communication system according to an embodiment of the present
(Continued)

disclosure comprises the steps of: transmitting, to a receiver, a magnetic field signal generated from a single coil included in the transmitter; and receiving, from the receiver, position information estimated on the basis of a received signal strength of the magnetic field signal.

20 Claims, 8 Drawing Sheets

(51) Int. Cl.
*H04W 4/029* (2018.01)
*G01B 7/14* (2006.01)
*G01R 33/483* (2006.01)

(58) Field of Classification Search
USPC .................. 455/456.1, 456.6, 550.1, 39
See application file for complete search history.

(56) References Cited

U.S. PATENT DOCUMENTS

| | | | |
|---|---|---|---|
| 2003/0080868 A1* | 5/2003 | Nelson .................. | G01V 3/104 340/551 |
| 2009/0180448 A1* | 7/2009 | Kobayashi ............ | H04W 40/08 370/338 |
| 2010/0039929 A1 | 2/2010 | Cho et al. | |
| 2010/0151789 A1* | 6/2010 | Suzuki ................. | G01S 5/0036 455/41.2 |
| 2011/0037471 A1* | 2/2011 | Nozaki ............ | G01R 33/34015 324/322 |
| 2011/0156957 A1* | 6/2011 | Waite ..................... | G01V 3/081 342/450 |
| 2012/0232838 A1* | 9/2012 | Kemppi ................ | G01C 17/28 702/150 |
| 2013/0005356 A1* | 1/2013 | Kobayashi .......... | H04W 64/003 455/456.1 |
| 2013/0049484 A1* | 2/2013 | Weissentern ............ | H02J 5/005 307/104 |
| 2013/0282438 A1* | 10/2013 | Hunter ..................... | G01S 1/72 705/7.32 |
| 2013/0324154 A1* | 12/2013 | Raghupathy .......... | G01S 5/0236 455/456.1 |
| 2013/0342400 A1* | 12/2013 | Meyer .................. | H04W 64/00 342/451 |
| 2014/0125575 A1* | 5/2014 | Samanta Singhar ... | G06F 3/011 345/156 |
| 2014/0186049 A1* | 7/2014 | Oshima .................... | H04W 4/21 398/118 |
| 2014/0186050 A1* | 7/2014 | Oshima .................. | H04B 10/11 398/118 |
| 2014/0240057 A1 | 8/2014 | Low et al. | |
| 2015/0247912 A1* | 9/2015 | Tang ...................... | G01S 5/0263 348/169 |
| 2015/0271641 A1* | 9/2015 | Sung ...................... | H04W 64/00 455/456.6 |
| 2015/0308270 A1* | 10/2015 | Wilmot .................. | G08G 1/166 701/301 |
| 2015/0309126 A1* | 10/2015 | Jung ...................... | G01C 21/20 702/150 |
| 2016/0269389 A1* | 9/2016 | Nakashima ............ | G06Q 10/06 |
| 2017/0004366 A1* | 1/2017 | Nakata ................... | B60Q 9/008 |
| 2017/0226849 A1* | 8/2017 | Fan ....................... | E21B 17/003 |
| 2017/0323311 A1* | 11/2017 | Naiki .................... | G01C 22/006 |
| 2017/0346349 A1* | 11/2017 | Shimokawa ............ | H02J 50/12 |
| 2018/0088207 A1* | 3/2018 | Feil ...................... | H04B 10/116 |
| 2018/0113189 A1* | 4/2018 | Khan ..................... | H04W 64/00 |
| 2018/0138752 A1* | 5/2018 | Wilson ..................... | H02J 50/80 |
| 2018/0149728 A1* | 5/2018 | Yoneyama ................ | G01S 5/14 |
| 2018/0372854 A1* | 12/2018 | Feil ...................... | H04B 10/116 |

FOREIGN PATENT DOCUMENTS

| | | | | |
|---|---|---|---|---|
| JP | 2002-340504 A | | 11/2002 | |
| JP | 2008-224489 | * | 9/2008 | .............. G01S 5/14 |
| KR | 10-2008-0053116 A | | 6/2008 | |
| KR | 10-2008-0105805 A | | 12/2008 | |
| KR | 101140338 B1 | | 5/2012 | |
| KR | 10-2014-0063650 A | | 5/2014 | |
| WO | 2011/065127 A1 | | 6/2011 | |

OTHER PUBLICATIONS

Written Opinion of the International Searching Authority dated Oct. 31, 2016 in connection with International Patent Application No. PCT/KR2016/009452.

Supplementary European Search Report dated Aug. 17, 2018 in connection with European Patent Application No. 16 83 9636.

* cited by examiner

METHOD AND APPARATUS FOR ESTIMATING POSITION IN WIRELESS COMMUNICATION SYSTEM

CROSS-REFERENCE TO RELATED APPLICATION(s)

This application is a 371 U.S. National Stage of International Patent Application No. PCT/KR2016/009452 filed on Aug. 25, 2016, which claims priority to Korean Patent Application No. 10-2015-0119641 filed on Aug. 25, 2015, each of which are incorporated herein by reference into the present disclosure as if fully set forth herein.

TECHNICAL FIELD

The present disclosure generally relates to a method and apparatus for estimating a position in a communication system, and more particularly, to a method and apparatus for estimating a position of a terminal based on a magnetic field signal.

BACKGROUND

Efforts have been made to develop an improved 5th-Generation (5G) communication system or a pre-5G communication system to meet the increasing demand for wireless data traffic after the commercialization of 4th-Generation (4G) communication system. For this reason, the 5G communication system or the pre-5G communication system is called a beyond 4G network communication system after 4G network or a post LTE system after an LTE system.

In order to achieve a higher data transmission rate, 5G communication systems are being considered for implementation in ultra-high frequency (mmWave) bands (for example, 60 GHz bands). In order to mitigate the path loss of radio waves in the ultra-high frequency bands and to increase the propagation distance of the radio waves, in the 5G communication system, beamforming, massive multi-input multi-output (massive MIMO), Full Dimensional MIMO (FD-MIMO), array antenna, analog beamforming, and large scale antenna technologies are being discussed.

In addition, in order to improve the network of a system, in the 5G communication system, technologies such as an evolved small cell, an advanced small cell, a cloud radio access network (cloud RAN), an ultra-dense network, Device to Device communication (D2D), wireless backhaul, a moving network, cooperative communication, Coordinated Multi-Points (CoMP), interference cancellation, and the like are being developed.

In addition in the 5G system, Hybrid FSK and QAM Modulation (FQAM) and Sliding Window Superposition Coding (SWSC), which are Advanced Coding Modulation (ACM) schemes, Filter Bank Multi-Carrier (FBMC), non-orthogonal multiple access (NOMA), and sparse code multiple access (SCMA), which are advanced access schemes, and the like are being developed.

On the other hand, the Internet has evolved into an Internet of Things (IoT) network in which information is exchanged between distributed components such as objects, in a human-centered connection network where humans generate and consume information. Internet of Everything (IoE) technology, which combines IoT technology with big data processing technology through connection with cloud servers, is also emerging. In order to implement IoT, technology elements such as sensing technology, wired/wireless communication, network infrastructure, service interface technology, and security technology are required. In recent years, technologies such as sensor network, Machine to Machine (M2M), Machine Type Communication (MTC), etc., for connection between objects have been studied. In an IoT environment, an intelligent Internet Technology (IT) service can be provided that collects and analyzes data generated from connected objects to create new value in human life. IoT can be applied to fields such as smart home, smart building, smart city, smart car or connected car, smart grid, health care, smart home appliance, advanced medical service, etc., through the convergence and combination of existing information technology (IT) and various industries.

Accordingly, various attempts have been made to apply the 5G communication system to the IoT network. For example, technologies such as a sensor network, M2M, MTC, etc., are implemented by the 5G communication technologies such as beamforming, MIMO, array antenna, etc. To apply the cloud RAN as the above-described big data processing technology may be an example of the convergence of 5G technology and IoT technology.

Recently, position-based services using the position of a terminal have attracted much attention due to the rapid spread of smart terminals. The position estimation in an indoor environment can be utilized in various ways such as position awareness and route guidance of a terminal within a large building or shopping mall, guidance to the position of a parked car in a large parking lot, rescue inside a large building in case of disaster such as fire or earthquake, and the like.

In such an indoor environment, the accuracy of the position estimation of the terminal is highly likely to be degraded due to interference signals to people and surrounding obstacles. Therefore, in order to secure the accuracy of a short distance (for example, 5 m) in a communication system, a plurality of Access Points (APs) must be installed within a certain range (for example, 10 m). However, when a plurality of APs is installed in the communication system, the installation cost increases and an algorithm for estimating the position of the terminal may be complicated. Therefore, there is a need for a method of increasing the accuracy of the position estimation of a terminal using one AP in a communication system.

SUMMARY

According to aspects of the present disclosure, a method and apparatus for estimating a position of a terminal based on a magnetic field signal are provided.

In addition, according to aspects of the present disclosure, a method and apparatus for estimating a position of a terminal including a coil for generating a magnetic field signal in a communication system using the terminal and an access point (AP) are provided.

In accordance with an aspect of the present disclosure, a method in which a transmitter performs position estimation in a communication system, includes: transmitting a magnetic field signal generated from one coil included in the transmitter to a receiver; and receiving position information of the transmitter estimated based on a Received Signal Strength (RSS) of the magnetic field signal from the receiver.

In accordance with another aspect of the present disclosure, a method in which a receiver performs position estimation in a communication system, includes: receiving a magnetic field signal from a transmitter through three coils having orientations orthogonal to each other; measuring an RSS of the magnetic field signal; estimating a position of the transmitter based on the RSS; and transmitting information about the estimated position to the transmitter.

In accordance with still another aspect of the present disclosure, a transmitter of which a position is estimated in a communication system includes: a control unit that controls a magnetic field signal generated from one coil included in the transmitter to be transmitted to a receiver and ascertains position information estimated based on an RSS of the magnetic field signal received from the receiver; and a transmission/reception unit that transmits the magnetic field signal to the receiver and receives the position information from the receiver.

In accordance with yet another aspect of the present disclosure, a receiver that estimates a position of a transmitter in a communication system includes: a reception unit that receives a magnetic field signal through three coils having different orientations; a control unit that measures an RSS of the magnetic field signal and estimates the position of the transmitter based on the RSS; and a transmission unit that transmits information about the estimated position to the transmitter.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Hereinafter, an exemplary embodiment of the present disclosure will be described in detail with reference to the accompanying drawings. In the following description, it should be noted that only portions required for comprehension of operations according to the embodiments of the present disclosure will be described and descriptions of other portions will be omitted not to make subject matters of the present disclosure obscure.

The main point of the present disclosure is that each of a transmitter and a receiver transmits and receives a magnetic field signal using a coil and the receiver estimates a position of a terminal (i.e., transmitter) based on Received Signal Strength (RSS) of the magnetic field signal.

To this end, a method and apparatus for estimating a position of a terminal in a communication system according to an embodiment of the present disclosure will be described in detail.

Figure 1:
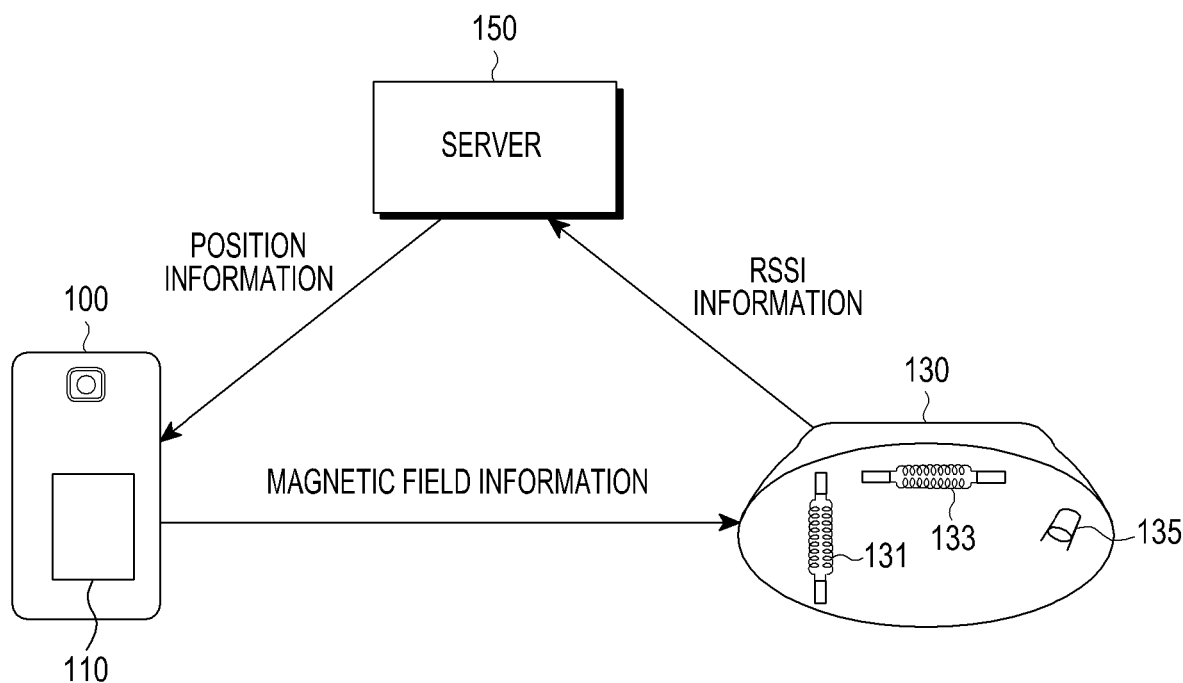
FIG. 1 illustrates a configuration of a communication system according to an embodiment of the present disclosure.

FIG. 1 illustrates a configuration of a communication system according to an embodiment of the present disclosure.

Referring to FIG. 1, the communication system according to an embodiment of the present disclosure includes a terminal 100, an Access Point (AP) 130, and a server 150. Here, the terminal 100 may be implemented as a transmitter, and the AP 130 and the server 150 may be implemented as a receiver as a single unit. The server 150 may be a position estimation server.

The terminal 100 includes a coil (inductor) 110 for generating a magnetic field signal in an internal transmission module. Here, the coil 110 is used for Near Field Communication (NFC) and Wireless Power Transfer (WPT), and resonates at a specific frequency $f_0$. Here, the terminal 100 may be a terminal capable of data and voice communication such as in a cellular phone, or a terminal (e.g., a tag type terminal) that performs only position estimation.

When detecting an event requesting position estimation, the terminal 100 transmits a magnetic field signal generated from the coil 110 to the AP 130.

At this time, the terminal 100 may detect an event requesting the position estimation according to predetermined information. For example, when the terminal 100 recognizes that a specific application (app) requiring position estimation is executed or it has entered a specific place, the terminal 100 may detect an event requesting position estimation. As another example, when the terminal 100 is a tag type terminal only for position estimation, the terminal 100 may detect an event requesting position estimation every predetermined period.

In order to notify the AP 130 that the magnetic field signal transmitted to the AP 130 belongs to the terminal 100, the terminal 100 may transmit the magnetic field signal to the AP 130, and at the same time, may also transmit information on an identifier of the terminal 100 to the AP 130. As another example, the terminal 100 may transmit the information on the identifier of the terminal 100 to the AP 130 before transmitting the magnetic field signal, and may transmit, when receiving a signal transmission request from the AP 130, the magnetic field signal to the AP 130. Obviously, the AP 130 can identify the terminal 100 in a method other than the above-described method.

The AP 130 receives the magnetic field signal from the terminal 100 through three coils 131, 133, and 135 having different orientations. Here, each of the three coils 131, 133, and 135 may have one of x-axis orientation, y-axis orientation, and z-axis orientation. In particular, one of the three coils 131, 133, and 135 may have an orientation orthogonal to the remaining two coils. The three coils 131, 133, and 135 may be included in the AP 130 or may be connected to (that is, attached to) the outside. Alternatively, only some of the three coils may be included in the AP 130 or may be connected to the outside.

The AP 130 may calculate a received signal strength indication (RSSI) of the magnetic field signal received from the terminal 100 based on the magnetic field signals received from the respective orientations. For example, the AP 130 may calculate the RSSI based on the magnetic field signals received in each orientation as shown in Equation 1 below.

$$|H_R| = \frac{m}{4\pi r^3} = \sqrt{H_x^2 + H_y^2 + H_z^2} \quad \text{Equation 1}$$

In Equation 1, $H_R$ denotes an RSSI of the magnetic field signal received from the terminal 100, $H_x$ denotes a signal received through the coil in the x-axis orientation, $H_y$ denotes a signal received through the coil in the y-axis orientation, and $H_z$ denotes a signal received through the coil in the z-axis orientation.

The AP 130 transmits information about the RSSI to the server 150 or the terminal 100. In this case, when the terminal 100 receives the RRSI information from the AP 130, it is possible to estimate the position of the terminal 100 in the same manner as that in the server 150.

The server 150 receives the measured RSSI information from the AP 130 and calculates a distance between the terminal 100 and the AP 130 according to the received RSSI information. Next, the server 150 estimates the position of the terminal 100 using information about the calculated distance and information about a built-in map. Here, when estimating the position of the terminal 100, the server 150 may more accurately estimate the position of the terminal 100 using information for position estimation received from another AP other than the AP 130. The server 150 transmits information about the estimated position of the terminal 100 to the terminal 100.

Meanwhile, the RSSI information measured from Equation 1 in the AP 130 is information that does not consider an orientation between the AP 130 and the terminal 100. When the server 150 calculates the distance between the AP 130 and the terminal 100 using the RSSI information that does not consider the orientation between the AP 130 and the terminal 100, an error may occur in calculating the distance.

Figure 2:
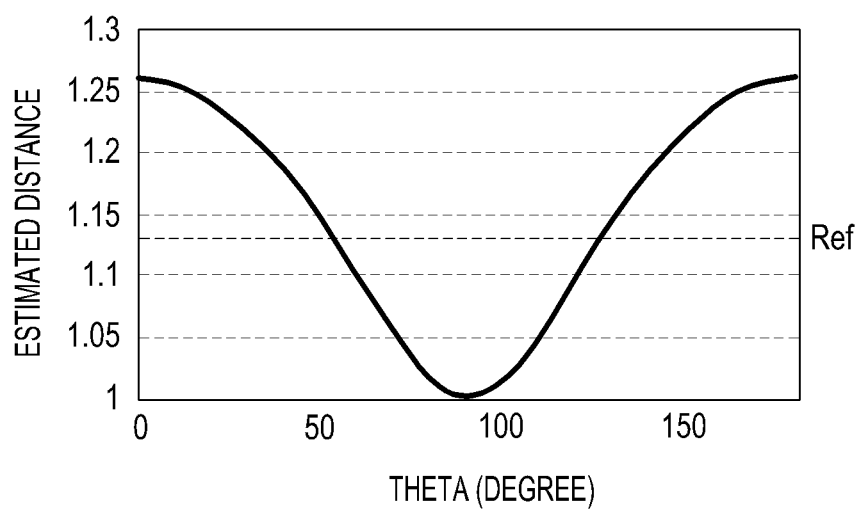
FIG. 2 is a graph illustrating distance information calculated in accordance with the orientation of a terminal according to an embodiment of the present disclosure.

For example, FIG. 2 is a graph illustrating distance information calculated in accordance with the orientation of a terminal according to an embodiment of the present disclosure.

In FIG. 2, an angle (theta) between the terminal (i.e., transmitter) and the AP (i.e., receiver) varies depending on the orientation of the terminal.

Referring to FIG. 2, when a distance between the AP 130 and the terminal 100 is calculated by changing the orientation of the terminal, it can be confirmed that a distance error of up to 13% may be generated according to the orientation of the terminal. Accordingly, in order to improve the accuracy of position estimation, an embodiment of the present disclosure proposes a method and an apparatus in which the AP 130 measures an RSSI in consideration of an orientation between the terminal 100 and the AP 130.

Figure 5:
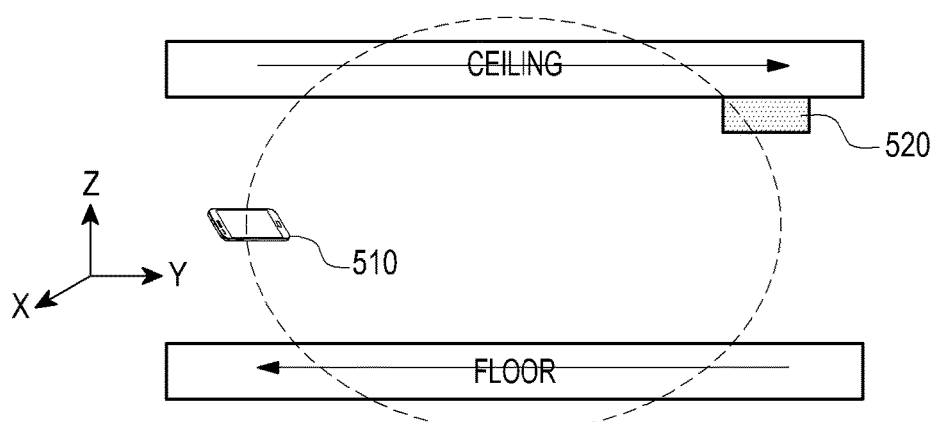

For example, objects through which a magnetic field signal cannot be transmitted in an indoor environment may be a ceiling and a floor. In this case, the AP 130 cannot receive the magnetic field signal transmitted by the terminal 100 as it is, but may receive the magnetic field signal deformed (i.e., including an interference signal) by the ceiling or floor in which the AP 130 is installed. That is, as shown in FIGS. 3 and 5, when even the same terminal 100 is connected to the AP 130 in a different orientation, the AP 130 may receive another magnetic field signal.

Figure 3:
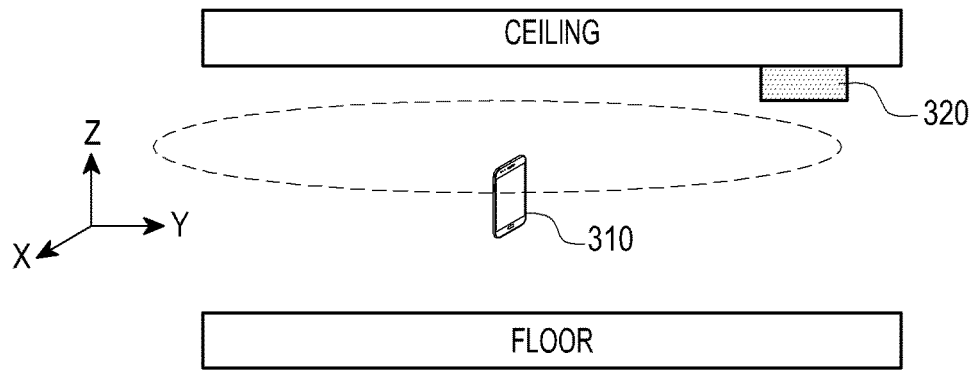
FIGS. 3 to 6 are diagrams illustrating an example in which an Access Point (AP) receives a magnetic field signal in accordance with the orientation of a terminal in a communication system according to an embodiment of the present disclosure.
Figure 6:
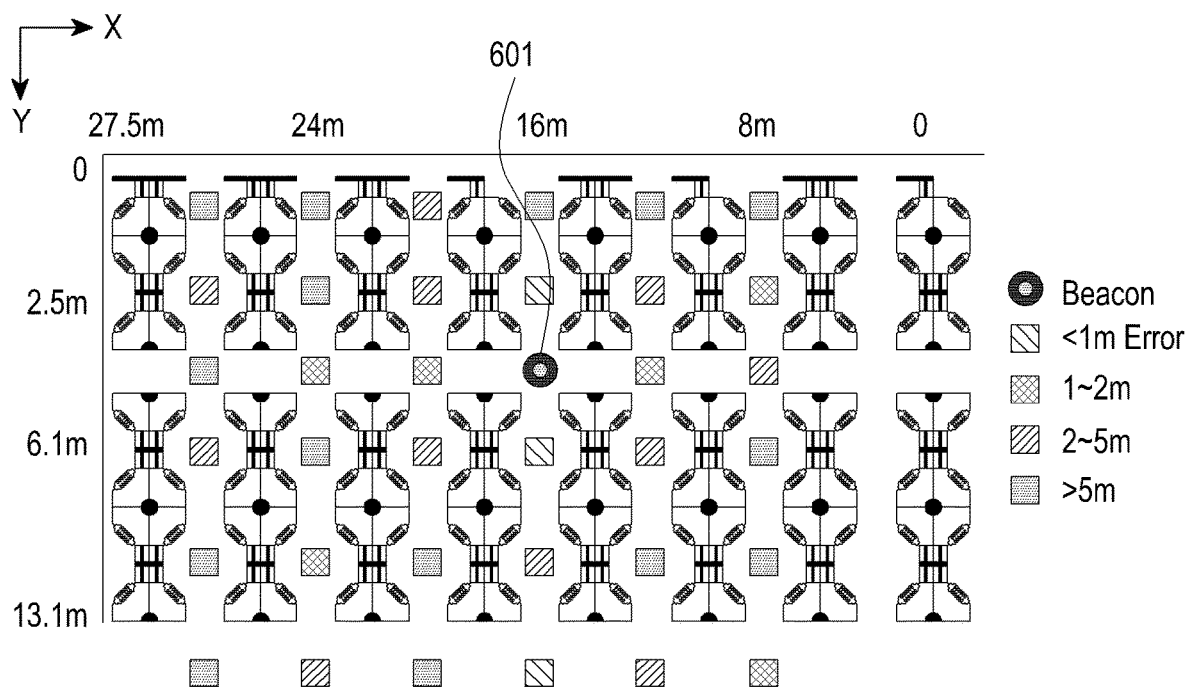

FIGS. 3 and 6 show an example in which an AP receives a magnetic field signal according to the orientation of a terminal in a communication system according to an embodiment of the present disclosure. In FIGS. 3 to 6, the AP includes only a coil in the z-axis orientation.

Referring to FIG. 3, when a terminal 310 is positioned perpendicular to the ceiling in a room, the magnetic field signal of the terminal 310 is transmitted to an AP 320 through an XY plane, so that the AP 320 can receive the magnetic field signal transmitted from the terminal 310 through the XY plane. In this case, since the magnetic field signal transmitted from the terminal 310 does not pass through a z-axis plane, the AP does not receive interference caused by the ceiling above a certain threshold value. From this, when the terminal 310 is positioned perpendicular to the ceiling, the AP 320 may receive the magnetic field signal having a low deformation rate among the magnetic field signals transmitted from the terminal 310. Accordingly, since the AP 320 calculates the RSSI using the magnetic field signal having a low deformation rate which is almost the same as the magnetic field signal from the terminal 310, a probability that an error occurs in the distance information calculated based on the RSSI may be lower than a predetermined threshold value.

Figure 4:
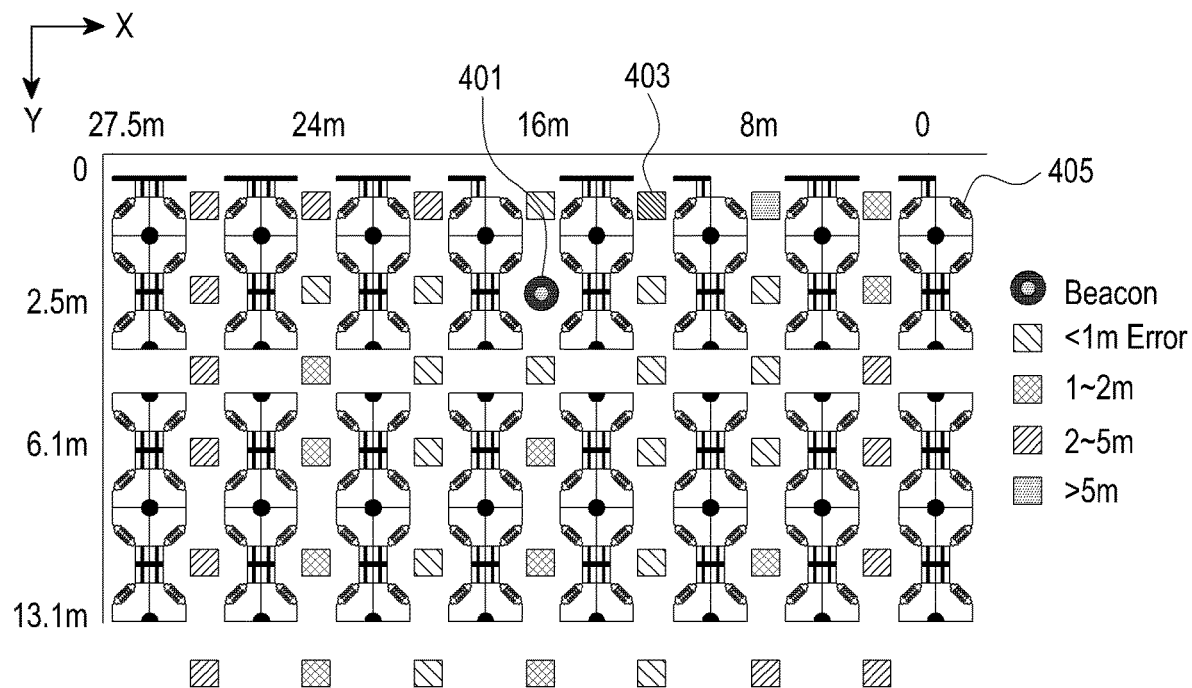

FIG. 4 is a graph illustrating an error of a distance calculated based on the RSSI by the AP when a terminal is positioned perpendicular to the ceiling in a door as shown in FIG. 3.

In FIG. 4, a beacon 401 performs the function of the AP. FIG. 4 shows an error calculated by measuring the position of the terminal between a table 405 and the beacon 401 at intervals of about 4 m in the x-axis and about 2.5 m in the y-axis. Referring to FIG. 4, errors of the distance calculated by the beacon 401 based on the RSSI are all 5 m or less, except for one specific point 403. In other words, according to the present disclosure, it is possible to perform position estimation with an error of 5 m or less only using one receiver, that is, the beacon 401, in an area of 27.5 m×13.1 m.

However, as shown in FIG. 5, when the terminal 510 is positioned in parallel with the ceiling in a room, the magnetic field signal of the terminal 510 is transmitted to an AP 520 through an XZ plane or an YZ plane, so that the AP 520 may receive the magnetic field signal transmitted from the terminal 510 through the XZ plane or the YZ plane. In this case, since the magnetic field signal transmitted from the terminal 510 passes through a Z-axis plane, the AP 520 may receive interference caused by the ceiling above a predetermined threshold value. From this, when the terminal 510 is positioned in parallel with the ceiling, the AP 520 may receive the magnetic field signal having a high deformation rate among the magnetic field signals transmitted from the terminal 510. Accordingly, since the AP 520 calculates the RSSI using the magnetic field signal having a high deformation rate among the magnetic field signals transmitted from the terminal 510, a probability that an error occurs in the distance information calculated based on the RSSI may be higher than a predetermined threshold value.

FIG. 6 is a graph illustrating an error of a distance calculated based on the RSSI by the AP when a terminal is positioned in parallel with the ceiling in a room as shown in FIG. 5.

In FIG. 6, a beacon 601 performs the function of the AP. The beacon 601 represents an error calculated by measuring the position of the terminal at intervals of about 4 m in the x-axis and about 2.5 m in the y-axis in the same manner as that in FIG. 4. Referring to FIG. 6, an error of a distance calculated based on the RSSI by the beacon 601 is 5 m or more at 50% or more of the number of measured terminals.

Accordingly, the AP 520 according to the embodiment of the present disclosure may estimate an accurate position of the terminal 510 by measuring the RSSI after modifying the magnetic field signal received from the terminal 510 to be the same as the magnetic field signal transmitted by the terminal 510.

To this end, hereinafter, an example in which three coils are attached to a ceiling existing in a room will be described, and a method in which the AP 520 calculates the RSSI by modifying the received magnetic field signal will be described.

Figure 7:
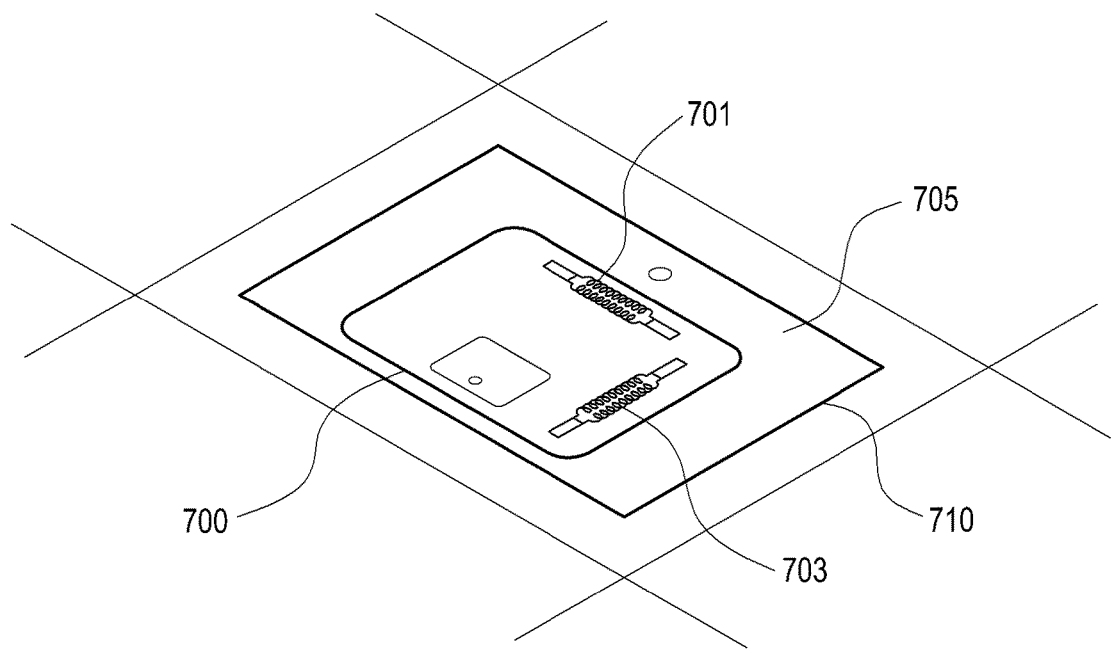
FIG. 7 is a diagram illustrating an example in which three coils are attached to a ceiling existing in a room according to an embodiment of the present disclosure.

FIG. 7 is a diagram illustrating an example in which three coils are attached to a ceiling existing in a room according to an embodiment of the present disclosure.

In the embodiment of FIG. 7, it is assumed that the three coils are attached to the ceiling, but obviously, the embodiment of the present disclosure can be applied to a case in which the coils are attached to a floor.

Referring to FIG. 7, a coil 701 in an x-axis orientation and a coil 703 in a y-axis orientation may be included in an AP 710, and a coil 705 in a z-axis orientation may be connected to the outside of the AP 710.

Specifically, the coil 705 in the z-axis orientation is a sheet type coil in the z-axis having a tile size of a ceiling, and may be configured to occupy a larger area than the AP 710. The coil 705 in the z-axis orientation may be installed to be included in a ceiling tile or may be installed as a transparent sheet on a tile surface. As another example, the coil 705 in the z-axis orientation may be attached to a ferrite sheet attached to the ceiling.

The coil 701 in the x-axis orientation and the coil 703 in the y-axis orientation included in the AP 710 may be installed on each of two orthogonal ferrite rods.

The AP 710 may receive a magnetic field signal from a terminal using the three coils configured as shown in the embodiment of FIG. 7.

As described above, the AP 710 measures the RSSI after modifying the magnetic field signal received from the terminal, taking into consideration that the magnetic field signal received from the terminal may be deformed.

As an example, the AP 710 according to the embodiment of the present disclosure may calculate the RSSI by applying, to a signal received from the coil in the z-axis orientation, height information (h) from a specific position to an installation position of the AP 710 in order to modify the signal received from the coil in the z-axis orientation, as shown in the following Equation 2. Here, the specific position may be a position corresponding to, for example, the floor.

$$|H_{modified}|=\sqrt{H_x^2+H_y^2+k(h)\times H_z^2} \qquad \text{Equation 2}$$

In Equation 2, $H_{modified}$ denotes an RSSI for a magnetic field signal modified by the AP 710, k(h) denotes an empirical value according to the height information (h), which may be set differently depending on a place where the AP 710 is installed.

As another example, when the AP 710 according to the embodiment of the present disclosure receives, from the terminal, orientation information (i.e., an angle) about the orientation between the terminal and the AP 710, the AP 710 may modify the magnetic field signal received from the terminal using the height information (h) from the specific position to the installation position of the AP and information about the orientation of the terminal, as shown in the following Equation 3.

$$|H_{modified}|=(1+k(h)\sin\theta)\times|H_{received}| \qquad \text{Equation 3}$$

In Equation 3, $H_{received}$ denotes an RSSI for the magnetic field signal which the AP 710 receives from the terminal, $H_{modified}$ denotes an RSSI for a magnetic field signal obtained such that the AP 710 modifies the height information (h) about the position of the AP 710 and the information about the orientation of the terminal (i.e., horizontal level (degree) of the terminal and the ground).

As described above, when the AP 710 calculates the RSSI by modifying the magnetic field signal received from the terminal using Equation 2 and Equation 3, a probability that an error occurs in information about the calculated distance is lowered.

Figure 8:
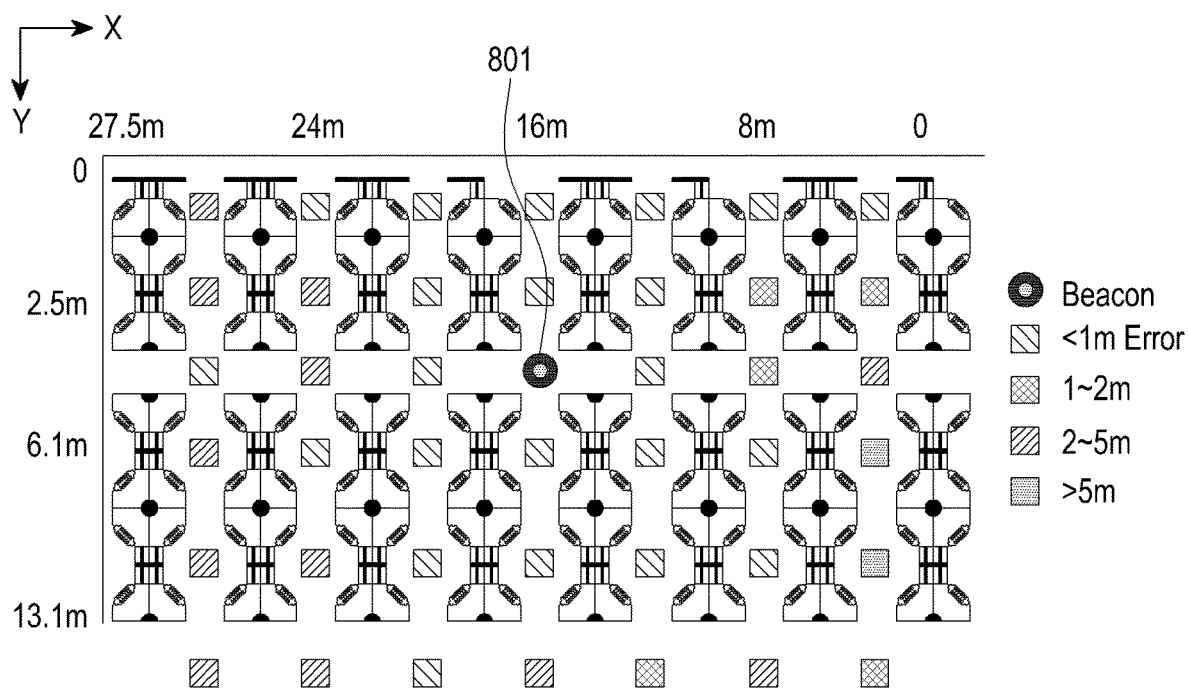
FIG. 8 is a diagram illustrating a probability that an error is generated in distance information when an AP measures a Received Signal Strength Indication (RSSI) by modifying a magnetic field signal received from a terminal according to an embodiment of the present disclosure.

FIG. 8 is a graph illustrating an error of a distance calculated by an AP based on an RSSI for the magnetic field signal modified according to FIG. 7.

In FIG. 8, a beacon 801 performs the function of the AP. The beacon 801 represents an error calculated by measuring the position of the terminal at intervals of about 4 m in the x-axis and about 2.5 m in the y-axis in the same manner as those in FIGS. 4 and 6.

The beacon 801 includes three coils as described above in FIG. 7 and calculates a modified RSSI using Equation 3.

Referring to FIG. 8, when the beacon 801 uses the RSSI information calculated from Equation 3, it can be seen that the error has been significantly reduced compared to FIG. 6.

Figure 9:
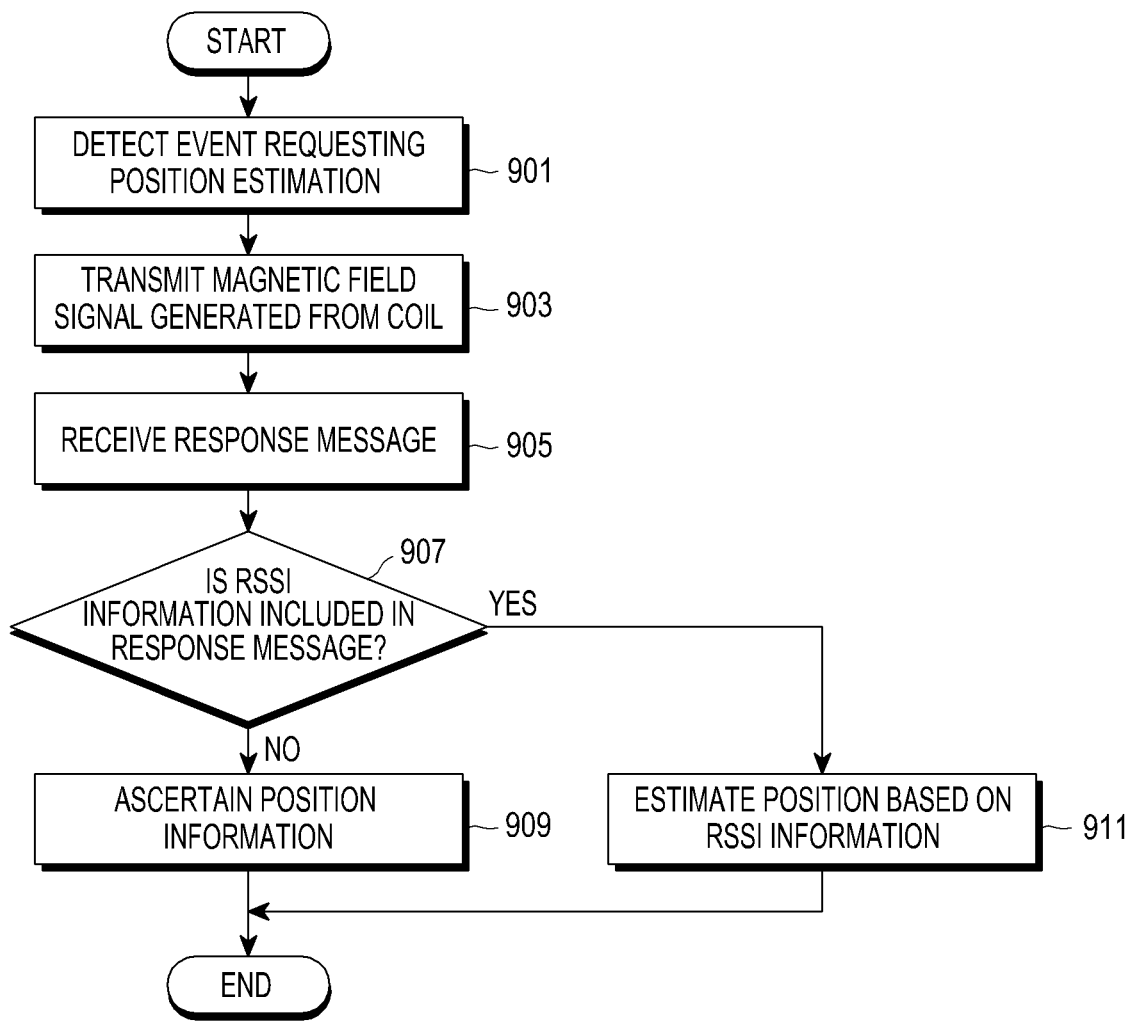
FIG. 9 is a diagram illustrating a method in which a transmitter performs position estimation in a communication system according to an embodiment of the present disclosure.

FIG. 9 shows a method in which a transmitter performs position estimation in a communication system according to an embodiment of the present disclosure. Referring to FIG. 9, the transmitter may correspond to the terminal 100 requesting the position estimation.

Referring to FIG. 9, in operation 901, the transmitter detects an event requesting position estimation. For example, when recognizing that a specific application on which position estimation is required is executed or the transmitter enters a specific place, the transmitter may detect an event requesting position estimation. As another example, when the transmitter is a tag type terminal only for position estimation, the transmitter may detect an event requesting position estimation every predetermined period.

Next, in operation 903, the transmitter transmits a magnetic field signal generated from a coil to a receiver. At this time, in order to notify the receiver that the transmitted magnetic field signal belongs to the transmitter, the transmitter may transmit the magnetic field signal to the receiver, and at the same time, may also transmit information about an identifier of the transmitter to the receiver. As another example, the transmitter may transmit the information about the identifier of the transmitter to the receiver before transmitting the magnetic field signal, and may transmit, when receiving a signal transmission request from the receiver, the magnetic field signal to the receiver. In addition, obviously, the receiver can identify the transmitter in a method other than the above-described method.

Next, in operation 905, the transmitter receives a response message including the RSSI information and the position information from the receiver. Next, in operation 907, the transmitter ascertains whether the RSSI information is included in the response message. In operation 909, when the RSSI information is not included in the response message (i.e., when the position information is included), the transmitter ascertains the position information included in the response message. On the other hand, in operation 911, when the RSSI information is included in the response message, the transmitter ascertains the RSSI information included in the response message, calculates a distance between the transmitter and the receiver based on the RSSI information, and performs position estimation according to the calculated distance information using a map stored therein.

Figure 10:
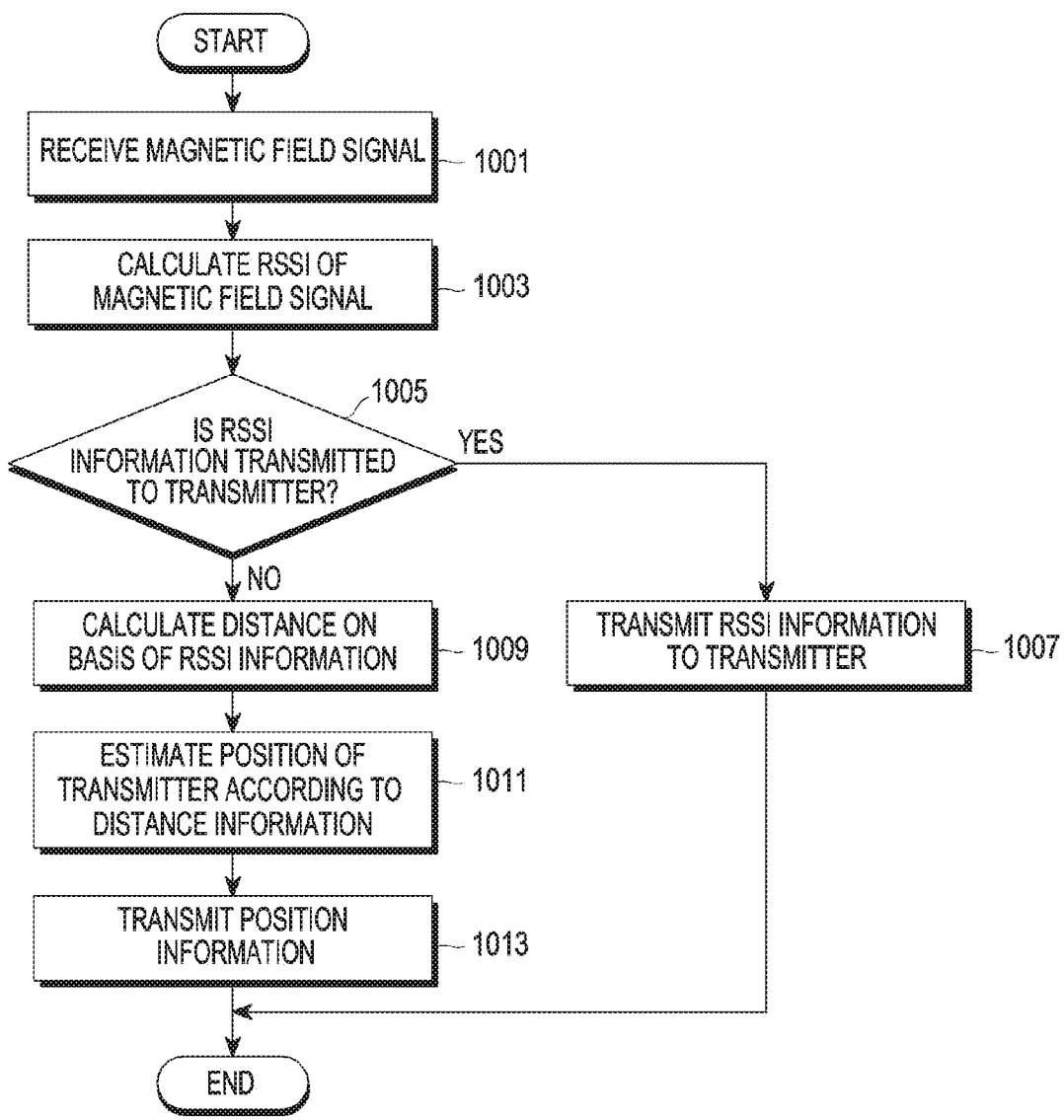
FIG. 10 is a diagram illustrating a method in which a receiver performs position estimation in a communication system according to an embodiment of the present disclosure.

FIG. 10 shows a method in which a receiver performs position estimation in a communication system according to an embodiment of the present disclosure.

Here, the receiver may correspond to the AP 130 or the server 150 of FIG. 1 which receives a request for the position estimation.

Referring to FIG. 10, in operation 1001, the receiver receives a magnetic field signal requesting position estimation from a transmitter. Here, the magnetic field signal may be received through three coils included inside or outside the receiver, or may be received wirelessly from the three coils included in a separate infrastructure device (e.g., a beacon for localization).

Next, in operation 1003, the receiver calculates an RSSI for the magnetic field signal using Equation 2 or Equation 3. Here, it is assumed that the receiver has already received information (i.e., at least one piece of information of height information and orientation information) required in Equation 2 and Equation 3 from the transmitter.

Next, in operation 1005, the receiver determines whether to transmit the measured RSSI information to the transmitter according to setting information of the communication system. In operation 1007, when the receiver determines to transmit the measured RSSI information to the transmitter, the receiver transmits a response message including the measured RSSI information to the transmitter. On the other hand, in operation 1009, when the receiver determines not to transmit the measured RSSI information to the transmitter, the receiver calculates a distance between the transmitter and the receiver based on the measured RSSI information. Next, in operation 1011, the receiver estimates the position of the transmitter according to the calculated distance in a map stored therein. Accordingly, the receiver may transmit the response message including the estimated position information to the transmitter.

Meanwhile, the position estimation process between the receiver and the transmitter according to an embodiment of the present disclosure may be terminated when an end event for the position service is detected or when the transmitter leaves a specific place.

Figure 11:
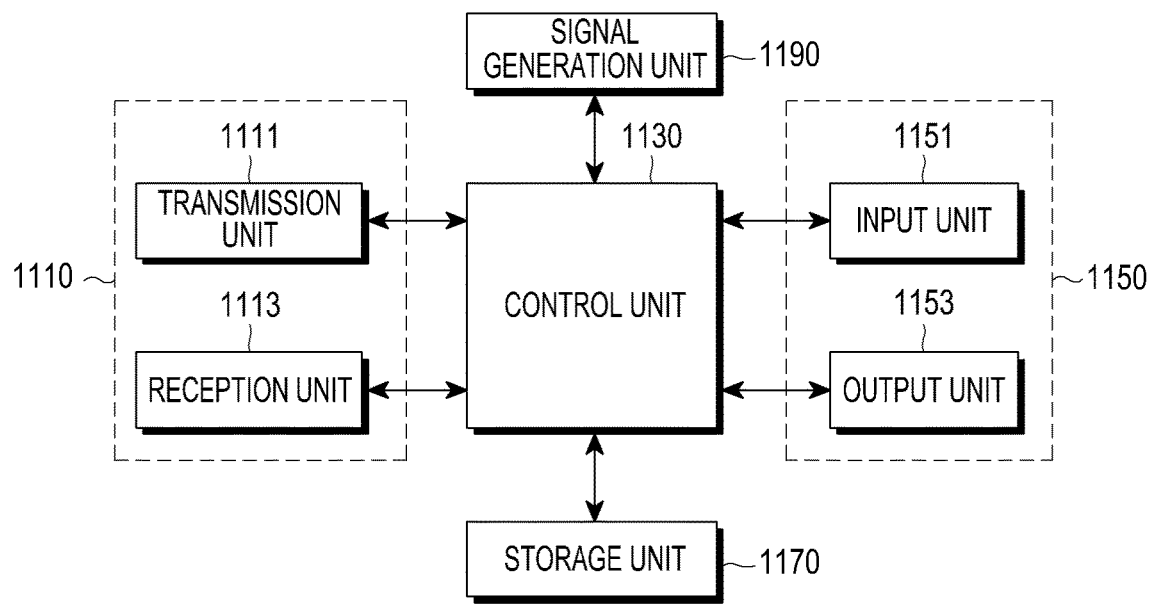
FIG. 11 is a diagram illustrating a detailed device configuration in which a transmitter according to an embodiment of the present disclosure performs position estimation.

FIG. 11 shows a detailed device configuration in which a transmitter according to an embodiment of the present disclosure performs position estimation.

Referring to FIG. 11, the transmitter may include a transmission unit 1111, a reception unit 1113, a control unit 1130, an input unit 1151, an output unit 1153, a storage unit 1170, and a signal generation unit 1190 in order to perform position estimation. Here, the transmission unit 1111 and the reception unit 1113 may be configured as one transmission/reception unit 1110, and the input unit 1151 and the output unit 1153 may be also configured as one input/output unit 1150.

First, the signal generation unit 1190 includes a coil having one axis according to an embodiment of the present disclosure.

Figures 12A, 12B, 12C:
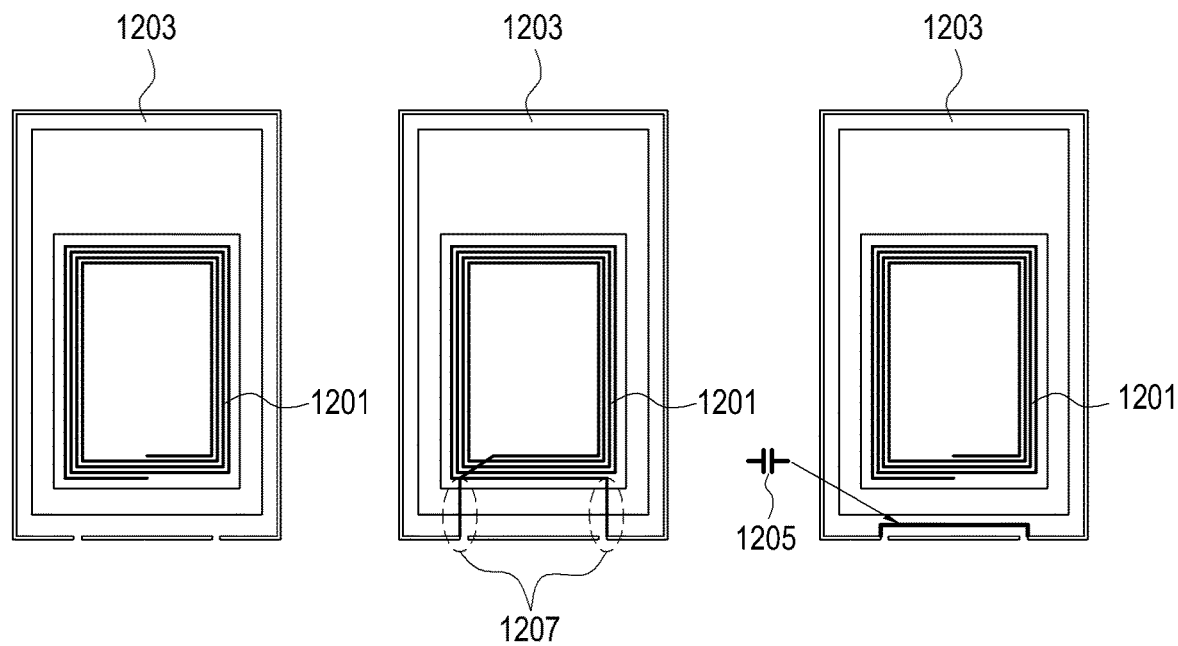
FIGS. 12A to 12C are diagrams illustrating embodiments in which a coil is connected to a transmitter according to an embodiment of the present disclosure.

FIGS. 12A to 12C show a coil connected to a transmitter according to an embodiment of the present disclosure as one example.

Referring to FIG. 12A, a coil 1201 is included in a metal frame 1203 configured outside the transmitter. Referring to FIG. 12B, the coil 1201 may connect a part of the coil 1201 to the metal frame 1203 to increase the area of the coil 1201 as shown in a section 1207 of FIG. 12B. In addition, referring to FIG. 12C, the signal generation unit 1190 may further include a capacitor 1205 so that a magnetic field signal generated in the coil 1201 of the transmitter is accurately transmitted to the receiver. The capacitor 1205 is connected to the metal frame and operates as a repeater resonator to form a resonant loop at the same frequency $F_0$ as that of the coil 1201.

The input unit 1151 detects an event requesting position estimation according to an embodiment of the present disclosure. The input unit 1151 may include a gyro sensor for measuring an angle between the transmitter and the receiver.

The control unit 1130 controls the overall operation of the transmitter, and in particular, controls operations related to an operation of estimating the position by the transmitter according to an embodiment of the present disclosure. Here, the operations related to the operation of estimating the position by the transmitter according to the embodiment of the present disclosure are the same as those described with reference to FIGS. 1 to 9, and thus, a detailed description thereof will be omitted here.

The transmission unit 1111 transmits various signals and various messages to the receiver under the control of the control unit 1130. Here, the various signals and various messages transmitted by the transmission unit 1111 are the same as those described with reference to FIGS. 1 to 9, and thus, a detailed description thereof will be omitted here.

In addition, the reception unit 1113 receives various signals and various messages from the receiver under the control of the control unit 1130. Here, the various signals and various messages received by the reception unit 1113 are the same as those described with reference to FIGS. 1 to 9, and thus, a detailed description thereof will be omitted here.

The storage unit 1170 stores programs and a variety of information related to the operation of estimating the position by the transmitter according to the embodiment of the present disclosure under the control of the control unit 1130.

The output unit 1153 outputs various signals and various messages related to the operation of estimating the position by the transmitter according to the embodiment of the present disclosure, under the control of the control unit 1130. Here, the various signals and various messages output by the output unit 1153 are the same as those described with reference to FIGS. 1 to 9, and thus, a detailed description thereof will be omitted here.

Meanwhile, FIG. 11 shows a case in which the transmitter is implemented with separate units such as the transmission/reception unit 1110, the control unit 1130, the input/output unit 1150, the storage unit 1170, and the signal generation unit 1190. However, obviously, the transmitter can be implemented in a form in which at least two of the transmission/reception unit 1110, the control unit 1130, the input/output unit 1150, the storage unit 1170, and the signal generation unit 1190 are integrated. In addition, the transmitter can be implemented as a single processor.

Figure 13:
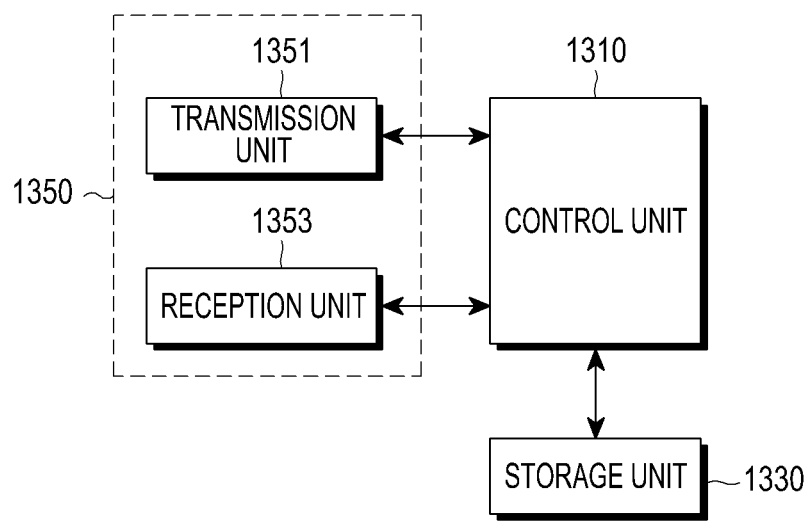
FIG. 13 is a diagram illustrating a detailed device configuration in which a receiver according to an embodiment of the present disclosure performs position estimation.

FIG. 13 shows a detailed device configuration in which a receiver according to an embodiment of the present disclosure performs position estimation.

Referring to FIG. 13, the receiver may include a control unit 1310, a storage unit 1330, a transmission unit 1351, and a reception unit 1353 in order to receive a magnetic field signal from a transmitter and estimate the position of the transmitter. Here, the transmission unit 1351 and the reception unit 1353 may be configured as one transmission/reception unit 1350.

The control unit 1310 controls the overall operation of the receiver, and in particular, controls operations related to an operation of estimating the position by the receiver according to an embodiment of the present disclosure. The operations related to the operation of estimating the position by the receiver according to an embodiment of the present disclosure are those described with reference to FIGS. 1 to 10, and thus a detailed description thereof will be omitted here.

The transmission unit 1351 transmits various signals and various messages to the transmitter under the control of the control unit 1310. Here, the various signals and various messages transmitted by the transmission unit 1351 are the same as those described with reference to FIGS. 1 to 10, and thus, a detailed description thereof will be omitted here.

In addition, the reception unit 1353 receives various signals and various messages from the transmitter under the control of the control unit 1310. The various signals and various messages received by the reception unit 1353 are the same as those described with reference to FIGS. 1 to 10, and thus, a detailed description thereof will be omitted here.

The storage unit 1330 stores programs and a variety of information related to the operation of estimating the position by the receiver according to an embodiment of the present disclosure, under the control of the control unit 1310. In addition, the storage unit 1330 stores the various signals and various messages which the reception unit 1353 receives from the transmitter.

Meanwhile, FIG. 13 shows a case in which the receiver is implemented with separate units such as the transmission/reception unit 1350, the control unit 1310, and the storage unit 1330. However, obviously, the receiver can be implemented in a form in which at least two of the transmission/reception unit 1350, the control unit 1310, and the storage unit 1330 are integrated. In addition, obviously, the transmitter can be implemented as a single processor.

Therefore, the transmitter may be provided with position-based service information based on precisely estimated position information from the receiver according to the embodiment of the present disclosure. Here, the position-based service includes an indoor navigation service, a position-based advertisement service, a product information service, an acquaintance finding service, and a missing child (distress) location finding service, and the like. In addition, when the transmitter is composed of a tag, the receiver according to the embodiment of the present disclosure can effectively provide an asset management service, a position-based service for staff management, and the like to a manager terminal managing the transmitter.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the aforementioned embodiments, but should be defined by the appended claims and equivalents thereof.

The invention claimed is:

1. A method for performing position estimation at a transmitter in a communication system, the method comprising:

transmitting a magnetic field signal generated from one coil included in the transmitter to a receiver;

receiving a response message including a Received Signal Strength Indication (RSSI), or position information from the receiver;

determining whether the RSSI is included in the response message;

in response to determining that the RSSI is included in the response message, calculating a distance between the transmitter and the receiver based on the RSSI, and performing the position estimation according to the calculated distance using a map stored in the transmitter; and in response to determining that the RSSI is not included in the response message, ascertaining position of the transmitter based on the position information included in the response message.

2. The method of claim 1, wherein the RSSI is received and measured through three coils having orientations in which magnetic field signals are orthogonal to each other.

3. The method of claim 1, wherein:

the RSSI is modified based on a height of the receiver, and the RSSI is modified based on information about a horizontal level between the transmitter and the ground.

4. The method of claim 1, further comprising:

transmitting information about a horizontal level between the transmitter and the ground.

5. The method of claim 1, wherein:

the magnetic field signal is a signal generated from a capacitor provided between the coil and a metal frame configured outside the transmitter, and a resonance by the metal frame and the capacitor has a same resonance frequency as that of the coil.

6. A method for performing position estimation in a communication system including a receiver and a transmitter, the method comprising:

receiving, at the receiver, a magnetic field signal from the transmitter through three coils having orientations orthogonal to each other;

measuring, at the receiver, a Received Signal Strength (RSS), of the magnetic field signal;

estimating, at the receiver, a position of the transmitter based on the RSS;

transmitting, from the receiver, a response message to the transmitter, wherein the response message includes position information indicating the estimated position to the transmitter or a Received Signal Strength Indication (RSSI);

determining, at the transmitter, whether the RSSI is included in the response message;

in response to determining that the RSSI is included in the response message, calculating, at the transmitter, a distance between the transmitter and the receiver based on the RSSI, and performing, at the transmitter, the position estimation according to the calculated distance using a map stored in the transmitter; and in response to determining that the RSSI is not included in the response message, ascertaining, at the transmitter, position of the transmitter based on the position information included in the response message.

7. The method of claim 6, wherein the estimating of the position of the transmitter includes estimating the position of the transmitter by modifying the magnetic field signal based on a height in which the receiver is installed from a specific position.

8. The method of claim 6, wherein the estimating of the position of the transmitter includes estimating the position of the transmitter by modifying the magnetic field signal based on information about a horizontal level between the transmitter and the ground.

9. The method of claim 6, further comprising:
receiving information about a horizontal level between the transmitter and the ground.

10. The method of claim 6, wherein the magnetic field signal is a signal generated from a coil and a capacitor included in the transmitter.

11. A transmitter for performing position estimation in a communication system, wherein the transmitter comprises:
a transceiver; and
a controller configured to control the transceiver to:
transmit a magnetic field signal generated from one coil included in the transmitter to a receiver; and
receive a response message including a Received Signal Strength Indication (RSSI), or position information from the receiver,
wherein the controller is further configured to:
determine whether the RSSI is included in the response message;
in response to determining that the RSSI is included in the response message, calculate a distance between the transmitter and the receiver based on the RSSI, and perform the position estimation according to the calculated distance using a map stored in the transmitter; and
in response to determining that the RSSI is not included in the response message, ascertain position of the transmitter based on the position information included in the response message.

12. The transmitter of claim 11, wherein the RSSI is received and measured through three coils having orientations in which magnetic field signals are orthogonal to each other.

13. The transmitter of claim 11, wherein:
the RSSI is modified based on a height of the receiver, and
the RSSI is modified based on information about a horizontal level between the transmitter and the ground.

14. The transmitter of claim 11, wherein the transceiver is further configured to transmit information about a horizontal level between the transmitter and the ground.

15. The transmitter of claim 11, wherein:
the magnetic field signal is a signal generated from a capacitor provided between the coil and a metal frame configured outside the transmitter, and
a resonance by the metal frame and the capacitor has a same resonance frequency as that of the coil.

16. A receiver for performing position estimation at the receiver in a communication system, the receiver comprising:
a transceiver configured to receive a magnetic field signal from a transmitter through three coils having orientations orthogonal to each other; and
a controller configured to measure a Received Signal Strength (RSS), of the magnetic field signal, estimate a position of the transmitter based on the RSS, and control the transceiver to transmit a response message to the transmitter, wherein the response message includes position information indicating the estimated position to the transmitter or a Received Signal Strength Indication (RSSI),
wherein the estimated position indicated by the position information is identified as a position of the transmitter, or the position of the transmitter is estimated based on a map stored in the transmitter and a distance between the transmitter and the receiver, wherein the distance between the transmitter and the receiver is calculated based on the RSSI.

17. The receiver of claim 16, wherein the controller is configured to estimate the position of the transmitter by modifying the magnetic field signal based on a height in which the receiver is installed from a specific position.

18. The receiver of claim 16, wherein the controller is configured to estimate the position of the transmitter by modifying the magnetic field signal based on information about a horizontal level between the transmitter and the ground.

19. The receiver of claim 16, wherein the transceiver is further configured to receive information about a horizontal level between the transmitter and the ground.

20. The receiver of claim 16, wherein the magnetic field signal is a signal generated from a coil and a capacitor included in the transmitter.

* * * * *